US012598693B2

(12) United States Patent
Birkett et al.

(10) Patent No.: US 12,598,693 B2
(45) Date of Patent: Apr. 7, 2026

(54) THICK FILM PRINTED COOLER FOR IMPROVED THERMAL MANAGEMENT OF DIRECT BONDED POWER DEVICES

(71) Applicant: Dana Canada Corporation, Oakville (CA)

(72) Inventors: Matthew S. Birkett, Toronto (CA); Andrei Catuneanu, Oakville (CA)

(73) Assignee: DANA CANADA CORPORATION, Oakville (CA)

( * ) Notice: Subject to any disclaimer, the term of this patent is extended or adjusted under 35 U.S.C. 154(b) by 240 days.

(21) Appl. No.: 18/364,335

(22) Filed: Aug. 2, 2023

(65) Prior Publication Data
US 2024/0090119 A1 Mar. 14, 2024

Related U.S. Application Data

(60) Provisional application No. 63/375,142, filed on Sep. 9, 2022.

(51) Int. Cl.
*H05K 1/02* (2006.01)
*H05K 3/12* (2006.01)

(52) U.S. Cl.
CPC ......... *H05K 1/0207* (2013.01); *H05K 3/1291* (2013.01)

(58) Field of Classification Search
CPC ........... H05K 2201/066; H05K 1/0209; H05K 1/0204; H05K 3/1291
See application file for complete search history.

(56) References Cited

U.S. PATENT DOCUMENTS

2014/0362552 A1* 12/2014 Murayama ........... H05K 1/0272
361/783

* cited by examiner

*Primary Examiner* — Jeremy C Norris
(74) *Attorney, Agent, or Firm* — McCoy Russell LLP

(57) ABSTRACT

A cooler assembly, comprising: a heat exchanger with a heat exchanger surface having a dielectric layer of dielectric material physically coupled thereto, wherein a single or plurality of layers of another material are coupled to an exposed surface of the dielectric layer; and at least one component coupled to the heat exchanger such that the at least one component is electrically isolated from the heat exchanger surface by the dielectric material, wherein the heat exchanger surface is electrically isolated with respect to the at least one component.

20 Claims, 6 Drawing Sheets

THICK FILM PRINTED COOLER FOR IMPROVED THERMAL MANAGEMENT OF DIRECT BONDED POWER DEVICES

CROSS REFERENCE TO RELATED APPLICATION

The present application claims priority to U.S. Provisional Application No. 63/375,142, entitled "THICK FILM PRINTED COOLER FOR IMPROVED THERMAL MANAGEMENT OF DIRECT BONDED POWER DEVICES", and filed on Sep. 9, 2022.

The entire contents of the above-listed application are hereby incorporated by reference for all purposes.

TECHNICAL FIELD

The present description relates to a system and method of manufacture for a heat exchanger and electrical components using a dielectric layer to thermally couple and electrically isolate the electrical components from the heat exchanger and other electrical components.

BACKGROUND AND SUMMARY

Electrical power devices may include semiconductor dies and other electrical components that are mounted on electrically isolated substrates, for example in the form of metallized ceramic substrates. During operation, the electrical components generate waste heat. Cooling may be accomplished by mechanically clamping the exposed metal surface of the substrate to a cooler, with a thermal interface material (TIM) interposed to improve thermal contact between the two surfaces by increasing thermal conductivity.

However, TIMs may not provide sufficient thermal conduction, and over time they can degrade or shift, losing effectiveness and causing degradation to the electrical device. Vehicle electrification is also increasing electrical power requirements, creating a corresponding increase in waste heat in vehicle applications.

To improve the thermal management of electrical devices, by increasing the rate heat transfer, the coolant side can be modified by increasing the coolant flow rate or incorporating more aggressive heat transfer surfaces. However, this can increase the pressure drop of the cooler and may have other system-wide effects, which places a natural limit on the potential for increasing the rate of heat transfer and thermal flux between the heat exchanger and electronic components. Another method is to directly integrate the power module with the cooler, eliminating and replacing the TIM layer with a strong, thermally conductive metallurgical bond. This can be done by bonding the exposed metal surface of the module substrate to the cooler, but the relatively large surface area, heat generation, and thermal expansion mismatches can cause difficulties in creating reliable joints.

The inventors herein have recognized these and other issues with such systems. In one example, a cooler is provided in the form of a heat exchanger with an electrically isolated surface that is compatible with metallurgical bonding techniques. In an example, a brazed or soldered heat exchanger is provided incorporating internal extended heat transfer surfaces. On the heat exchanger, a layer of dielectric material may form a dielectric layer sufficient to electrically isolate portions of one or more exposed surfaces of the heat exchanger. Further, a conductor layer of thermally and electrically conductive material compatible with metallurgic bonding techniques may be applied on top of the dielectric layer. The dielectric and conductive layers may be applied using thick film printing techniques. A method for assembling the previously described components is also provided.

The use of the conductive material compatible with metallurgic bonding techniques may allow for the electronic components and/or other electrical components to have greater thermal conduction with the heat exchanger. The use of a dielectric layer may allow for the components on the conducting layers (e.g., conductor layers and bulk metal layers) to be electrically isolated. In this way, it is possible to allow for the TIM and/or a metallized ceramic substrate, used to electrically isolate the electrical components from the heat exchanger, to be eliminated from the assembly of the electrical components and the heat exchanger. Elimination of the TIM and/or metallized ceramic substrate may increase the rate of heat exchange between the heat exchanger and electrical components and increase the lifespan of the electronic components, thereby allowing the components to be integrated directly with the cooler with only the dielectric layer between, at least in some examples.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

The description relates to a heat exchanger paired with a plurality of electrical components. The heat exchanger may be used as a cooler to cool the electrical components including components of circuit boards and or other electronics, which may be mounted in a vehicle system. Components of the heat exchanger may be brazed or soldered together, therein forming a brazed or soldered heat exchanger. Electrical components, such as electronic components, may be bonded to the heat exchanger, such as via brazing or soldering. When assembled, the heat exchanger and electrical components may form a heat exchanger electronic assembly. The heat exchanger lacks a thermal interface material (TIM) and is instead bonded and/or thermally coupled to the heat exchanger. The heat exchanger electronic assembly may include a layer of dielectric material printed between the heat exchanger to electrically isolate the electrical components from the heat exchanger, allowing for the optional elimination of a metallized ceramic substrate from the heat exchanger electronic assembly. The heat exchanger electronic assembly may also include a layer of conducting material that may be metallurgically bonded to and couple to the dielectric material, therein creating with the dielectric material an electrically isolated surface compatible with metallurgic bonding. The layer of conducting material may be printed. A bulk metal layer may be interposed between an electronic component and the layer of conducting material. The bulk metal layer may be metallurgically bonded to the conducting layer. The electronic component may be metallurgically bonded to the bulk metal layer.

Figure 1:
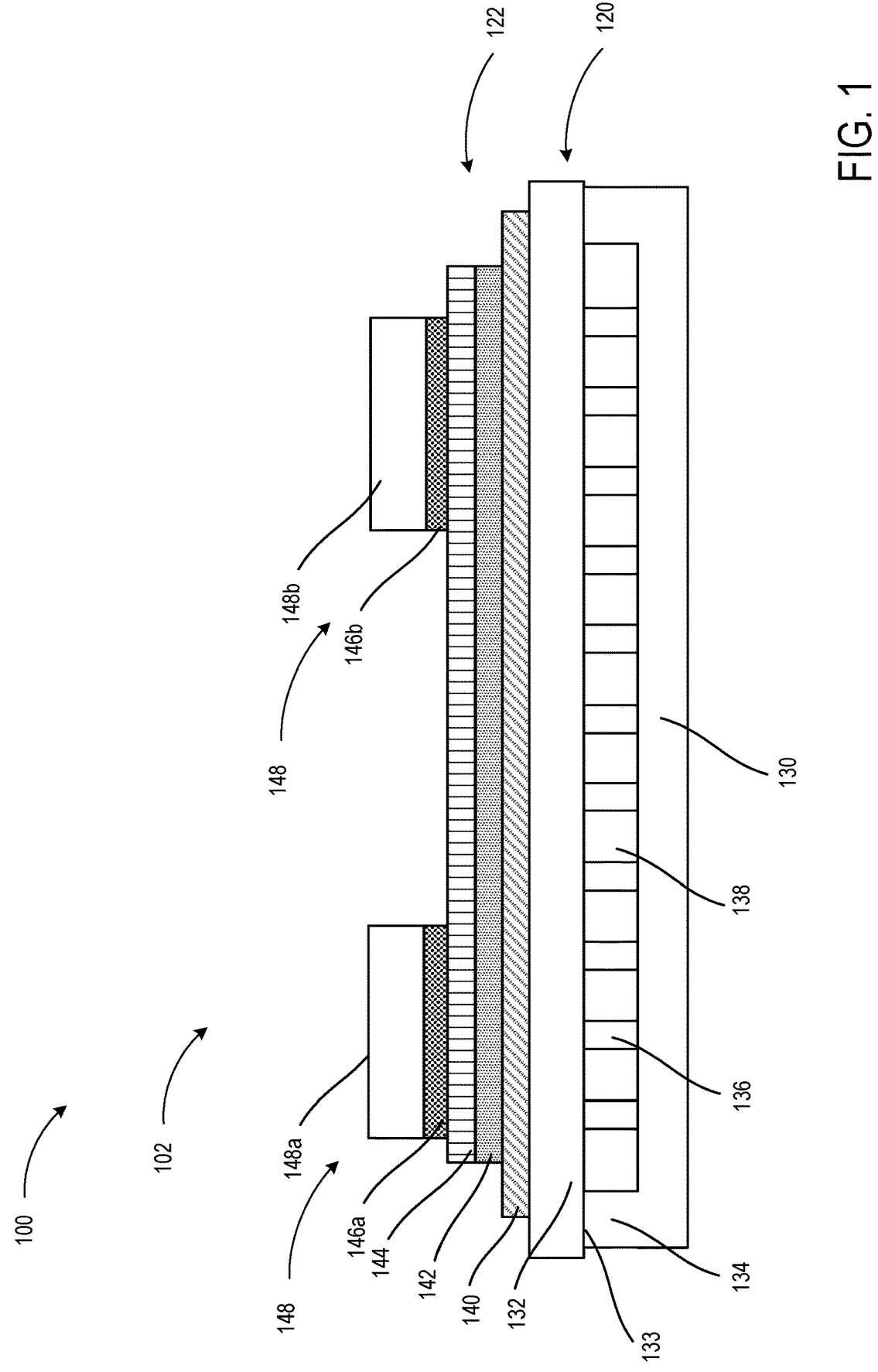
FIG. 1 Shows a schematic first example embodiment of the present disclosure circuit board coupled to a heat exchanger.
Figure 2:
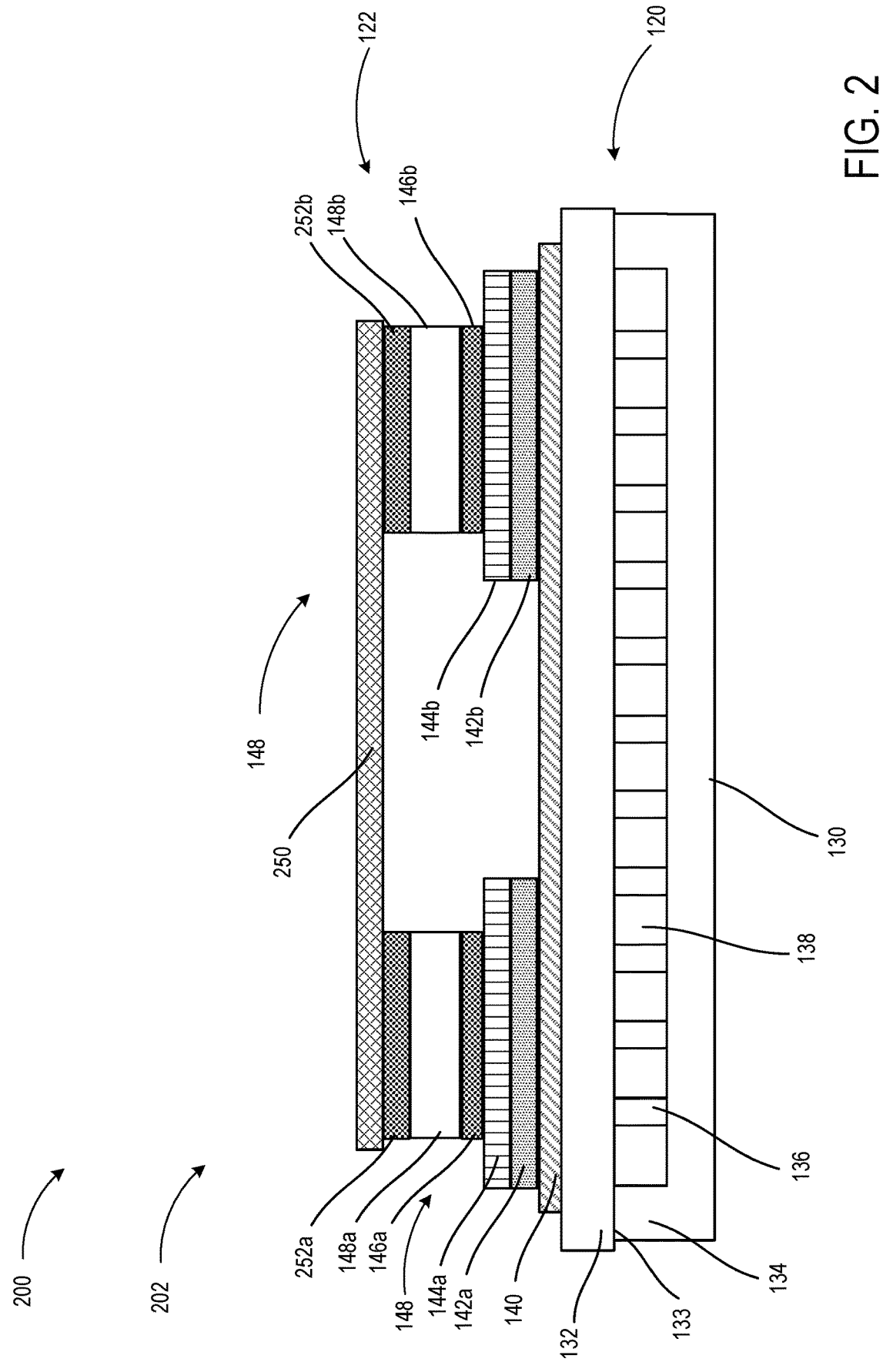
FIG. 2 shows a schematic first example embodiment of the present disclosure circuit board coupled to a heat exchanger.
Figure 3:
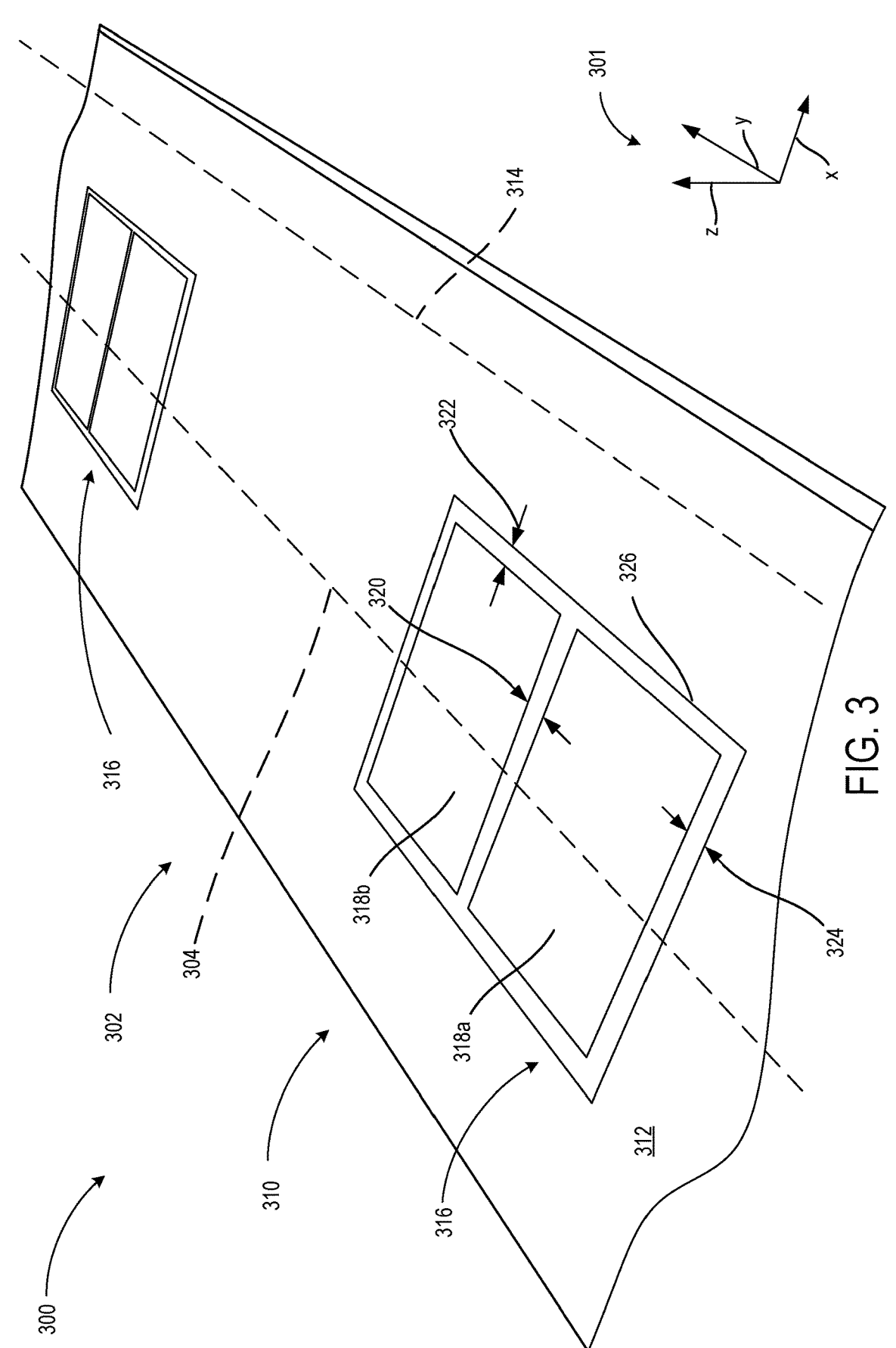
FIG. 3 shows a heat exchanger electronic assembly before assembly from a first isometric view.
Figure 4:
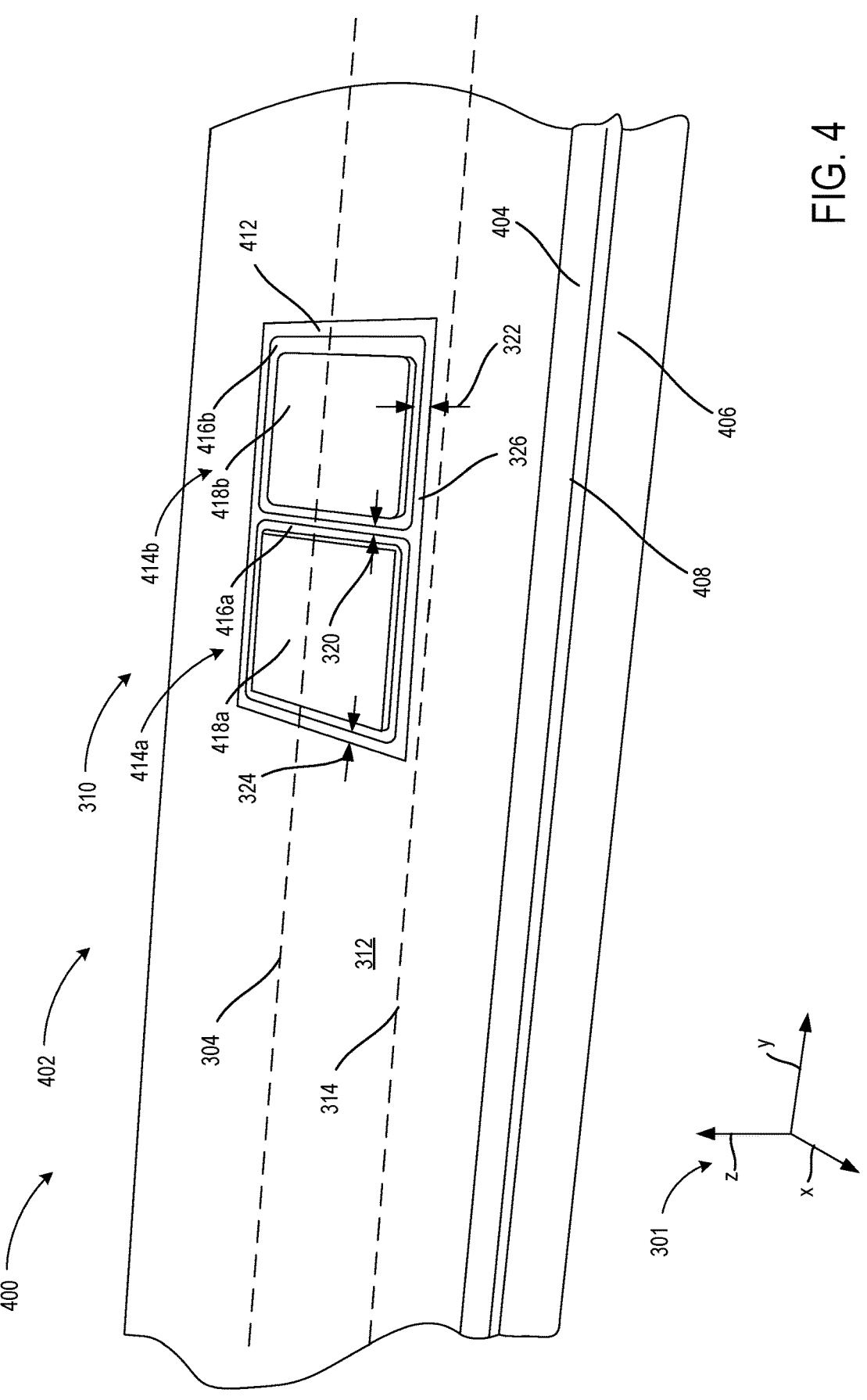
FIG. 4 shows a shows a heat exchanger electronic assembly with printed substrates from a second isometric view.
Figure 5:
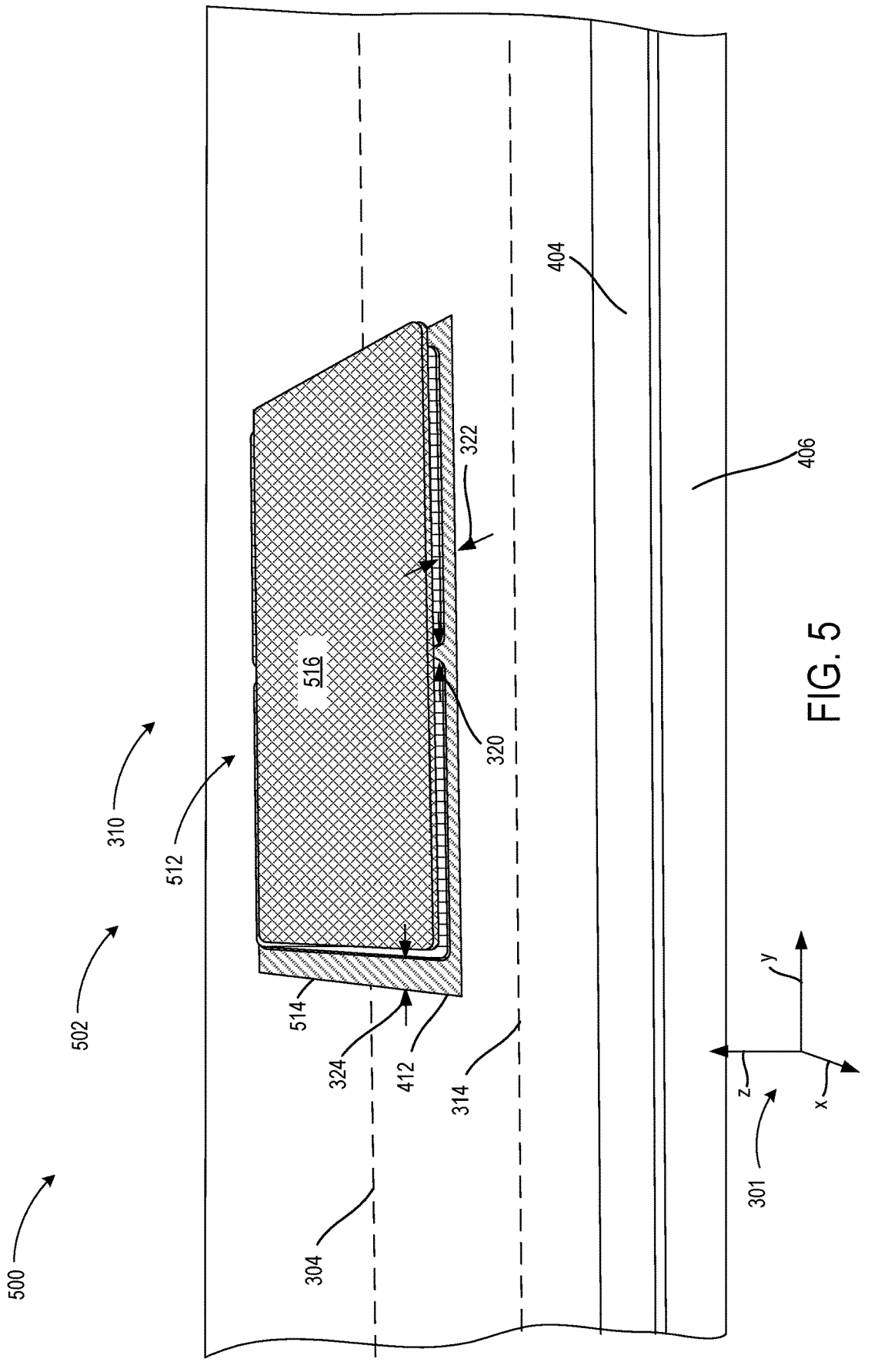
FIG. 5 shows a heat exchanger electronic assembly after assembly from a side view.
Figure 6:
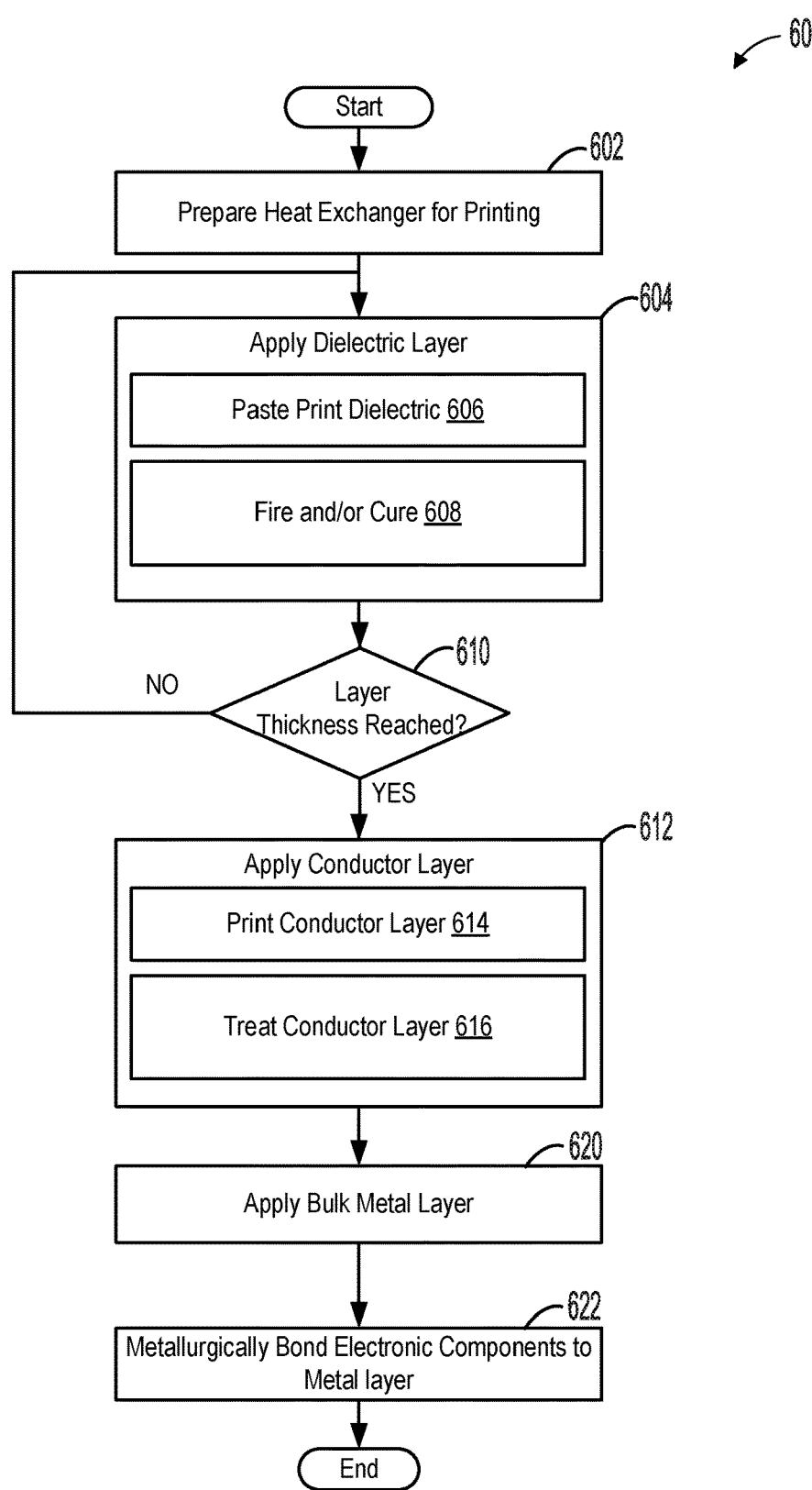
FIG. 6 shows a flowchart of one example of a method to manufacture the heat exchanger electronic assembly.

A schematic of a first example of heat exchanger electronic assembly is shown in FIG. 1. A schematic of a second example of heat exchanger electronic assembly with an electrical interconnect is shown in FIG. 2. FIG. 3 shows a first isometric view of a heat exchanger electronic assembly of the present disclosure before assembly. FIG. 4 shows a second isometric view of a partially assembled heat exchanger electronic assembly with printed substrates. FIG. 5 shows a side view of a portion heat exchanger electronic assembly when assembled with a circuit board coupled to the substrates of FIG. 5. A method of manufacturing a circuit board or other electrical components onto the heat exchanger to form the heat exchanger electronic assembly is shown in FIG. 6.

It is also to be understood that the specific assemblies and systems illustrated in the attached drawings, and described in the following specification are exemplary embodiments of the inventive concepts defined herein. For purposes of discussion, the drawings are described collectively. Thus, like elements may be commonly referred to herein with like reference numerals and may not be re-introduced.

FIGS. 1-2 show schematics of example configurations with relative positioning of the various components. FIGS. 3-5 show example configurations with approximate positions. FIGS. 3-5 are shown to scale, although other relative dimensions may be used.

Further, FIGS. 1-5 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example. Moreover, the components may be described as they relate to reference axes included in the drawings.

Turning to FIG. 1, a schematic 100 of an example of a first heat exchanger electronic assembly 102 is shown. The first assembly 102 is formed of a heat exchanger 120 and at least an electrical section 122. The electrical section 122 may be components or features coupled to the heat exchanger 120 that may conduct or affect electricity. The electrical section 122 may include and be used to electrically couple a plurality of electrical components 148, while the heat exchanger 120 may be used to cool and/or maintain the temperature of the electrical components 148 of electrical section 122 within a range of temperature thresholds. One electrical section, electrical section 122, is shown in schematic 100 physically coupled to the heat exchanger 120. However, it is to be appreciated that a plurality of electrical sections may be physically coupled to the heat exchanger 120 that are of the configuration of electrical section 122 in schematic 100 and first assembly 102. Each electrical section of the plurality of electrical sections may be patterned into pads that are electrically and physically isolated from one another.

The heat exchanger 120 may have at least one heat exchanger surface, wherein heat exchange may be facilitated through. The heat exchanger 120 may be comprised of a core plate 130 and a top plate 132 brazed or soldered together at a plurality of interfaces. For this example, the core plate 130 may have a plurality of outer walls 134 coupled to the top plate 132. The top plate 132 may be brazed or soldered at a plurality of first interfaces 133 on the top of the outer walls 134, coupling the top plate 132 to the core plate 130. Between the core plate 130 and top plate 132 are a plurality of heat transfer enhancements 136, such as fins, turbulators, dimples, or pin fin structures. The top surface of top plate 132 may be a heat exchanger surface, through which heat transfer may be facilitated between electrical section 122 and the heat exchanger 120.

For example, the heat transfer enhancements 136 may be fins and turbulators and may be formed separately of the core plate 130 and top plate 132. For this example, the heat transfer enhancements may be brazed or soldered to the core plate 130 and top plate 132. For this example, the interfaces 133 may include surfaces heat transfer enhancements 136 that may be brazed or soldered to the top plate 132. For another example, the heat transfer enhancements 136 may be dimples and may be formed of the core plate 130. For this example, the heat transfer enhancements 136 may be brazed or soldered to the top plate 132. For another example, the heat transfer enhancements 136 may be a pin fin structure and formed as part of the top plate 132. For this example, the heat transfer enhancements 136 may be brazed or soldered to the core plate 130. However, it is to be appreciated that the heat transfer enhancements 136, may be non-limiting and other forms of heat transfer enhancements may exist and be formed from or separate of the core plate 130 or top plate 132.

A plurality of channels 138 may be formed between the surfaces of the heat transfer enhancements 136 and between the surfaces of a heat transfer enhancements 136 and an outer wall 134. The plurality of channels 138 may be used to transport work fluid, such as coolant, to remove thermal energy conducted away from the electrical section 122 by the top plate 132 and core plate 130. The surfaces of the channels 138 form internal extended heat transfer surfaces for the work fluid to remove thermal energy.

Electrical section 122 includes a layer comprised of dielectric material, referred to herein as a dielectric layer 140, coupled to the top surface of the top plate 132. The electrical section 122 may contain at least one component that is coupled to the heat exchanger and electrically isolated from the heat exchanger surface, via the dielectric layer 140. One dielectric layer, dielectric layer 140, is shown in schematic 100 physically coupled to the heat exchanger 120. However, it is to be appreciated that a plurality of dielectric layers may be physically coupled to the heat exchanger 120 that are of the configuration of dielectric layer 140 in schematic 100 and first assembly 102. Each dielectric layer of the plurality of dielectric layers may be patterned into a plurality of first pads that are electrically and physically isolated from one another.

A single or plurality of layers of another material or a plurality of other materials may be coupled to an exposed surface of the dielectric layer 140. An exposed surface of the dielectric layer 140 may be a surface not physically coupled to the heat exchanger 120. The electrical section 122 includes layer of thermally and electrically conductive material, referred to herein as a conductor layer 142, may be coupled to the top surface of the dielectric layer 140. The dielectric layer 140 may be physically coupled to the heat exchanger 120 via applying dialectic material using a paste printing technique. Likewise, the conductor layer 142 may be physically coupled to the dielectric layer via applying the thermally and electrically conductive material using a paste printing technique. For example, the dielectric and/or conductor layers 140, 142 may be applied to their respective coupling surfaces as films using a thick film printing technique. The conductor layer 142 has high contents of metals or metallic substances allowing for the conductor layer 142 to be compatible with metallurgical bonding techniques (e.g. soldering, Ag sinter bonding). The compatibility of the conductor layer 142 with metallurgic bonding techniques allows for a layer of bulk metal, referred to herein as a bulk metal layer 144, to be metallurgically bonded to the conductor layer 142. The bulk metal layer 144 may be formed of copper (Cu) or a metal with high thermal conductivity. The bulk metal layer 144 may act as both an electrical and thermal conductor for the electrical components 148. The bulk metal layer 144 may therein be an additional conductor layer complementary to the conductor layer 142. The bulk metal layer 144 has a thickness great enough to provide a heat spreading function for the electrical components 148 coupled.

At least an electrical component of electrical components 148 may be coupled to the bulk metal layer 144, via a metallurgic bond. The electrical component may be a die. This electrical component of electrical components 148 may be coupled via the bulk metal layer 144 to the conductor layer 142, and via the conductor layer 142 to the dielectric layer 140. The metallurgic bond may include a die attach. Likewise, coupled to the top surface of the bulk metal layer 144 may be the plurality of electrical components 148, such as dies or other electronic components. A plurality of electrical components 148 may therein be coupled to a bulk metal layer 144 via metallurgic bonds. The plurality of electrical components 148 may be coupled via the bulk metal layer 144 to the conductor layer 142, and via the conductor layer 142 to the dielectric layer 140.

For example, there may be pair of electrical components 148: a first electronic component 148a and a second electronic component 148b. The first and second electronic components 148a, 148b may be physically, electrically, and thermally coupled to the bulk metal layer 144 via a first die attach 146a and a second die attach 146b, respectively. The first and second die attaches 146a, 146b thermally couple the first and second electronic components 148a, 148b, respectively, to the heat exchanger 120 via the bulk metal layer 144, conductor layer 142, and the dielectric layer 140. However, the dielectric layer 140 substantially reduces the discharge of electrical energy or electrical coupling from the first and second electronic components 148a, 148b to the heat exchanger 120. The dielectric layer 140 may therein be used to electrically isolate portions of one or more exposed surfaces, such as the top surface of the top plate 132. The dielectric layer 140 and conductor layer 142 may allow for portions of one or more exposed surfaces that are electrically isolated on the heat exchanger 120 to be compatible with metallurgic bonding.

The dielectric layer 140 and conductor layer 142 may allow the first assembly 102 to be operated without a TIM and/or a metallized ceramic substrate. Likewise, the dielectric layer 140 and conductor layer 142 may allow the first assembly 102 to be operated without a component or feature that incorporates a TIM and/or a metallized ceramic substrate. For example, the dielectric layer 140 may electrically isolate the top surface of the top plate 132 from the conductor layer 142. With the top surface of the top plate 132 electrically isolated, the first assembly 102 may electrically isolate the electrical components 148, without a metallized ceramic sandwiched between the die attaches of the electrical components 148 and the top plate 132. Likewise, without the metallized ceramic, the first assembly 102 may allow for heat exchange to keep the electrical components 148 cooled below a first threshold of temperature without a TIM sandwiched between the conductor layer 142 and the top surface of the top plate 132. Additionally, the dielectric layer 140 may allow for the heat exchanger 120 to keep the electronic components cooled below a first threshold of temperature, without a TIM sandwiched between dielectric layer 140 and top surface of the top plate 132.

Turning to FIG. 2, a schematic 200 of a second heat exchanger electronic assembly 202 is shown. One electrical section, electrical section 122, is shown in schematic 100 physically coupled to the heat exchanger. However, it is to be appreciated that a plurality of electrical sections may be physically coupled to the heat exchanger 120 that are of the configuration of electrical section 122 in schematic 200 and the second heat exchanger electronic assembly 202. The plurality of electrical sections may each be patterned into pads that are electrically and physically isolated from one another.

There may be a plurality of conductor layers that physically couple to the dielectric layer. Each of the plurality of conductor layers may be patterned into one of a plurality of second pads. Each of the pads are physically and electrically isolated from each other when coupled to the dielectrically layer. There may be a plurality of bulk metal layers coupled to the dielectric layer 140, wherein each bulk metal layer may be physically coupled at least one of the conductor layers. Each bulk metal layer may be metallurgically bonded, such as via brazing or soldering, to at least one the conductor layers. There may be a plurality of electronic components, wherein each electronic component may be coupled a bulk metal layer via a metallurgic bond, such as via brazing or soldering.

On the top surface of the dielectric layer 140 of the second assembly 202, the electronic component may split into a plurality of components. For this example, there may be a first conductor layer 142*a* and a second conductor layer 142*b* coupled to the top surface of the dielectric layer 140. The first conductor layer 142*a* and second conductor layer 142*b* may be patterned into pads. The top surfaces of the first and second conductor layers 142*a*, 142*b* may be coupled to a first bulk metal layer 144*a* and a second bulk metal layer 144*b*, respectively. The first and second bulk metal layers 144*a*, 144*b* may be coupled to the first and second electronic components 148*a* and 148*b*, via the first and second die attaches 146*a*, 146*b*, respectively. For the second assembly 202, the first and second conductor layers 142*a*, 142*b* may function the same or similar to the conductor layer 142. Additionally, the first and second bulk metal layers 144*a*, 144*b* may function the same or similar to the bulk metal layer 144. However, the dielectric layer 140 may keep the first electronic component 148*a* electrically isolated from the second electronic component 148*b* with respect to the heat exchanger 120.

The second assembly 202 has an electrical interconnector 250, such as a circuit board, that may electrically couple the first electronic component 148*a* to the second electronic component 148*b*, and vice versa. The electrical interconnector 250 may be electrically coupled to the first and second electronic components 148*a*, 148*b* via a first top die attach 252*a* and a second top die attach 252*b*. Electrical energy may be transferred through the electrical interconnector 250 between the first and second electronic components 148*a*, 148*b*.

The dielectric layer 140 and first and second conductor layers 142*a*, 142*b* may allow the second assembly 202 to be operated without a TIM and/or a metallized ceramic substrate. The heat exchanger surface of heat exchanger 120 may not comprise and may not be physically coupled to a component or feature comprising a TIM. The heat exchanger surface of heat exchanger 120 may not comprise and may not be physically coupled to a component or feature comprising a metallized ceramic.

It is to be appreciated that the quantity of components of the electrical section 122 in the first and second assemblies 102, 202 may be non-limiting, and there may greater plurality of electronic or other electrical components 148 in other examples.

A set of reference axes 301 are provided for comparison between views shown in FIG. 3-5. The reference axes 301 indicate a y-axis, an x-axis, and a z-axis. In one example, the z-axis may be parallel with a direction of gravity and the x-y plane may be parallel with a horizontal plane that a heat exchanger electronic assembly 302 may rest upon. When referencing direction, positive may refer to in the direction of the arrow of the y-axis, x-axis, and z-axis and negative may refer to in the opposite direction of the arrow of the y-axis, x-axis, and z-axis. A filled circle may represent an arrow and axis facing toward, or positive to, a view. An unfilled circle may represent an arrow and an axis facing away, or negative to, a view.

Turning to FIG. 3, a first isometric view 300 of a heat exchanger electronic assembly 302. The heat exchanger electronic assembly 302 in the first isometric view 300 centered along a longitudinal axis 304. For this example, the longitudinal axis 304 is approximately parallel with the y-axis. For the example in FIG. 3, the heat exchanger electronic assembly 302 is partially assembled comprised of a heat exchanger 310.

The length 314 of the heat exchanger 310 may be approximately parallel with the longitudinal axis 304. The top surface 312 of the heat exchanger 310 has a plurality of printing regions, wherein dielectric material may be printed. The plurality of print regions may allow for a plurality of dielectric layers of dielectric material, such as dielectric layer 140 of FIGS. 1-2, to be printed and physically coupled to the top surface 312. Likewise, there may a conductor layer and a bulk metal layer, such as conductor layer 142 and bulk metal layer 144 of FIG. 1, per each of the print regions. Alternatively, there may be a plurality of conductor layers and a plurality of bulk metal layers, such as conductor layers 142*a*, 142*b* and bulk metal layers 144*a*, 144*b* of FIG. 2, for each print region. The dielectric layers may isolate components physically coupled to the print regions to be electrically isolated from the top surface 312. The top surface 312 may be an electrically isolated surface for the heat exchanger 310, similar to the top surface of top plate 132 of FIGS. 1-2.

For this example, there may be a dielectric print region 316, wherein a dielectric material may be printed. Within the dielectric print region 316 are a first isolated print region 318*a* and a second isolated print region 318*b*. The first and second isolated print regions 318*a*, 318*b* may be separated by a first distance 320. Additionally, the first and second isolated print regions 318*a*, 318*b* may be separated from edges 326 of the dielectric print region 316 by a second distance 322 and a third distance 324. After the dielectric material is printed and treated on the area of dielectric print region 316, a conductor material may be printed on the first and second isolated print regions 318*a*, 318*b* to form pads of conductor material. The area of the dielectric print region 316 containing the first distance 320 between the first and second isolated print regions 318*a*, 318*b* may have dielectric material but substantially no conductor material. The first distance 320 may electrically isolate the pads of conductor material printed on the first and second isolated print regions 318*a*, 318*b* from one another. The first distance 320 may therein electrically isolate electrical components 148, such as first and second electronic components 148*a*, 148*b* of FIGS. 1-2, when metallurgically bonded to separate pads of conductor material. The area of the dielectric print region 316 containing the second and third distances 322, 324 between the first and second isolated print regions 318*a*, 318*b* and the edges 326 may be printed with dielectric material but substantially no conductor material. The second and third distances 322, 324 may therein electrically isolate the pads of conductor material printed on the first and second isolated print regions 318*a*, 318*b* from the top surface 312. The second and third distances 322, 324 may therein electrically isolate electrical components, such as the first and second electronic components 148*a*, 148*b*, from the top surface 312 when metallurgically bonded to the pads of conductor material.

Turning to FIG. 4, shows a second isometric view 400 of a heat exchanger electronic assembly 402. The heat exchanger electronic assembly 402 may be the same or similar to heat exchanger electronic assembly 302. Heat exchanger 310 may be comprised of top plate 404 and core plate 406, that may be the same or similar to the top plate 132 and the core plate 130 of FIG. 1, respectively. The top plate 404 and core plate 406 may be brazed or soldered at an interface 408. The heat exchanger electronic assembly 402 may be the same as or similar to heat exchanger electronic assembly 302.

The heat exchanger electronic assembly 402 is partially assembled, with a dielectric substrate 412 formed of a layer of dielectric material. The dielectric substrate 412 may be arranged into a pad. The dielectric substrate 412 may be a first pad of material printed onto the top surface 312. There may be a plurality of dielectric substrates, comprising dielectric substrate 412, that may be printed for each of the dielectric print regions, such as dielectric print region 316. In addition, a second or a plurality of second pads may be physically coupled to an exposed surface each dielectric substrate including dielectric substrate 412. For example, on top of the dielectric substrate 412 are a first pad 414a and a second pad 414b. The first pad 414a and the second pad 414b, may be physically coupled to the exposed surface, for this example a top surface, of the dielectric substrate 412.

The dielectric substrate 412 may be formed of dielectric material and be the same or similar to the dielectric layer 140. The dielectric substrate 412 may be printed on approximately the area of dielectric print region 316. The first and second pads 414a, 414b may be formed above and share approximately the same area with first and second isolated print regions 318a, 318b, respectively. The first pad 414a may be formed of a conducting material as a first conductor layer 416a and a bulk metal material forming a first bulk metal layer 418a. Likewise, the second pad 414b may be formed of a conducting material as a first conductor layer 416a and a bulk metal material forming a second bulk metal layer 418b. The first and second bulk metal layers 418a, 418b may be located above and metallurgically bonded to the first and second conductor layers 416a, 416b, respectively. The first and second conductor layers 416a, 416b may be and function the same or similar to the first and second conductor layers 142a, 142b, respectively. The first and second bulk metal layers 418a, 418b may be and function the same or similar to the first and second bulk metal layers 144a, 144b, respectively.

The area of the dielectric print region 316 containing the first distance 320 between the first and second isolated print regions 318a, 318b may have dielectric material from the dielectric substrate 412 but substantially no conductor material. The first distance 320 may therein electrically isolate the first and second pads 414a, 414b formed on the first and second isolated print regions 318a, 318b, respectively, from one another. The first distance 320 may therein isolate electrical components, such as first and second electronic components 148a, 148b, metallurgically bonded to the first and second pads 414a, 414b from one another. The area of the dielectric substrate 412 containing the second and third distances 322, 324, surrounding the first and second pads 414a, 414b, may have dielectric material but substantially no conductor material. The second and third distances 322, 324 may therein electrically isolate the first and second pads 414a, 414b from the top surface 312. The second and third distances 322, 324 may therein electrically isolate electrical components, such as the first and second electronic components 148a, 148b, metallurgically bonded to first and second pads 414a, 414b from the top surface 312.

Turning to FIG. 5, it shows a side view 500 of a heat exchanger electronic assembly 502. The heat exchanger electronic assembly 502 may be the same or similar to heat exchanger electronic assembly 402. Elements of the heat exchanger electronic assembly 402 described with respect to FIG. 4 included in FIG. 5 are equivalently numbered and may not be reintroduced, for brevity.

A circuit board 512 may be coupled to the first and second pads 414a, 414b via metallurgic bonding to the first and second bulk metal layers 418a, 418b. The circuit board 512 may be composed of an electrical interconnect 514 that has a plurality of electronic components 516 on the top surface.

The circuit board 512 may be metallurgically bonded to electrical components, such as dies or other electronic components, that may be the same or similar to electrical components 148 via die attaches. Through these electrical components, the circuit board 512 may be metallurgically bonded to the first and second bulk metal layers 418a, 418b below the electrical interconnect 514 via die attaches. As an example, the die attaches and metallurgic bonding for heat exchanger electronic assembly 502 may be performed using an Ag sinter. However, it is to be appreciated that the method of forming die attaches and metallurgic bonding is non-limiting, and other forms of die attaches and metallurgic bonding, such as soldering, may be used.

Turning to FIG. 6, it shows a flowchart of a method 600 used to manufacture and assemble electrical components onto a heat exchanger, such as heat exchanger 310 of FIG. 3, to create a heat exchanger electronic assembly, such as heat exchanger electronic assembly 502. Method 600 is a method of assembling an electrical section, such as the electrical section 122 of first assembly 102 and second assembly 202 of FIG. 2 and FIG. 3, respectively. Method 600 starts and proceeds to the first block 602. At the first block 602, the heat exchanger has been assembled and is brought into a position to be printed upon by electronic printing tools and other electronic assembly tools. Once the heat exchanger is in position to begin printing, method 600 may proceed to block 604.

At block 604 the dielectric layer, such as dielectric layer 140, may be applied to the heat exchanger. Block 604 is comprised of a plurality of sub steps. Block 604 begins with block 606, wherein the material of the dielectric layer is paste printed as a film via a thick film print technique onto the top surface of the heat exchanger. When a layer dielectric material has been printed, method 600 proceeds from block 606 to block 608. At block 608, the dielectric layer is treated through a process of firing and curing. After block 608, when the dielectric layer is fired and cured, method 600 exits block 604 and proceeds to 610. At 610 an operator or automated device may determine if the dielectric layer has a thickness, e.g. height of dielectric layer above the top surface of the heat exchanger, above a minimum threshold to isolate the electrical components from the heat exchanger. If the dielectric layer is below the minimum threshold of thickness (e.g., 610 is no), the method 600 proceeds back to block 604 to apply and treat another layer of dielectric material. The process of block 604 may be repeated a plurality of times.

Returning to block 610, if the dielectric layer is above the minimum threshold of thickness (e.g., 610 is yes), method 600 may proceed to block 612. At block 612 a conductor layer, such as the conductor layer 142 or first and second conductor layers 142a, 142b, is applied to the upper surface of the dielectric layer. Block 612 is comprised of a plurality of sub steps. Block 612 begins with block 614, wherein the material of the conductor layer is printed as a film via a thick film print technique onto the top surface of the dielectric layer. For one example the conductor layer may be printed as separate pads on the dielectric layer, such as in the second assembly 202. For this example, there are regions between and surrounding a plurality of printed pads the conductor layer where conductor material is unprinted. For another example, the conductor layer may be printed across the majority of area of the dielectric layer, such as in first assembly 102. For this example, there are regions surrounding printed pads of the conductor layer where conductor material is unprinted. When the conductor layer has been printed, method 600 proceeds from block 614 to block 616. At block 616, the conductor layer is treated through a process of firing. At block 616 the conductor layer may also be cured. After block 616, when the conductor layer is fired and cured, method 600 may exit block 612.

After block 612, method 600 proceeds to block 620. At block 620 the bulk metal layer may be applied to the surface of the conductor layer. The bulk metal layer may be metallurgically bonded to the conductor layer using bonding techniques, such as soldering, Ag sinter bonding, or brazing. For example, the bulk metal may be pre-patterned shapes of smaller or similar areas to the areas printed with the conductor layer before being metallurgically bonded. For another example, the bulk metal may be patterned during metallurgically bonding through additive manufacturing. After block 620, the method 600 may proceed to block 622, wherein the electrical components, such as the first and second electronic components 148*a*, 148*b*, may be metallurgically bonded to the bulk metal layer. At block 622 the electronics may be metallurgically bonded using similar techniques as metallurgically bonding the bulk metal layer to the conductor layer in block 620.

It is to be appreciated that the order of manufacture of the assembly is not limiting, and therein the order of some steps may be changed. For example, the steps in block 620 and block 622 may be reversed. For this example, electronic or electrical components may be metallurgically bonded to the bulk metal layer in a separate sub-assembly. For this example, the metallurgically bonded electrical components and bulk metal layer may be metallurgically bonded to the conductor layer and coupled to the heat exchanger after the sub-assembly.

Thus, disclosed herein are systems, components, and method to form a heat exchanger electronic assembly, wherein the electronics components may be thermally coupled and electrically isolated from the heat exchanger via a layer of dielectric material. The dielectric layer allows for the elimination of a TIM and metallized ceramic substrate, and therein may increase the rate of heat exchange between the heat exchanger and electrical components and increase the lifespan of the components of the heat exchanger electrical assembly.

The disclosure also provides support for a cooler assembly, comprising, a heat exchanger having a surface, wherein a dielectric layer comprised of dielectric material is coupled to the heat exchanger surface, a conductor layer of thermally and electrically conducting material that is compatible with metallurgic bonding, a bulk metal layer that is compatible with metallurgic bonding, and an electrical component, wherein, the dielectric layer is physically coupled to the heat exchanger surface. In a first example of the system, the conductor layer is physically coupled to a top surface of the dielectric layer. In a second example of the system, optionally including the first example, the conductor layer is a printed thick film layer. In a third example of the system, optionally including one or both of the first and second examples, the bulk metal layer is physically coupled to a top surface of the of the conductor layer. In a fourth example of the system, optionally including one or more or each of the first through third examples, the bulk metal layer is metallurgically bonded to the top surface of the conductor layer. In a fifth example of the system, optionally including one or more or each of the first through fourth examples, the electrical component is physically coupled to the top surface of the conductor layer and/or bulk metal layer. In a sixth example of the system, optionally including one or more or each of the first through fifth examples, the electrical component is brazed or soldered to the conductor layer and/or bulk metal layer. In a seventh example of the system, optionally including one or more or each of the first through sixth examples in which there are a plurality of dielectric layers, a plurality of conductor layers, a plurality of bulk metal layers, and a plurality of electrical components. In an eighth example of the system, optionally including one or more or each of the first through seventh examples plurality of dielectric layers patterned into a series of first pads coupled to the heat exchanger surface, and the first pads that are physically and electrically isolated from one another. In a ninth example of the system, optionally including one or more or each of the first through eighth examples, each of the first pads of dielectric material couples at least one of the conductor layers, one of the bulk metal layers, and at least one of the electrical component, wherein at least a second pad comprising one of the conductor layers physically couples each of the first pads of dielectric material, and at least one of the bulk metal layers is coupled to the second pad, and at least one of the electrical components is physically and electrically coupled to the bulk metal layer. In a tenth example of the system, optionally including one or more or each of the first through ninth examples, there may be a plurality of the electronic components physically and electrically coupled to the bulk metal layer. The disclosure also provides support for a cooler assembly, comprising, a heat exchanger having an electrically isolated surface compatible with metallurgic bonding, wherein the electrically isolated surface couples at least a dielectric layer of material, a plurality of conductor layers of thermally and electrically conducting material that is compatible with metallurgic bonding, a plurality of bulk metal layers that are compatible with metallurgic bonding, and a plurality of electrical components, wherein, the dielectric layer is physically coupled to the electrically isolated surface, the plurality of conductor layers are physically coupled to the dielectric layer, each of the bulk metal layers are physically and electrically coupled to one of the conductor layers, and each of the electrical components are electrically coupled to one of the bulk metal layers. In a first example of the system, the electrical components are electrically coupled to an electrical interconnector.

It will be appreciated that the configurations and routines disclosed herein are exemplary in nature, and that these specific embodiments are not to be considered in a limiting sense, because numerous variations are possible. Moreover, unless explicitly stated to the contrary, the terms "first," "second," "third," and the like are not intended to denote any order, position, quantity, or importance, but rather are used merely as labels to distinguish one element from another. The subject matter of the present disclosure includes all novel and non-obvious combinations and sub-combinations of the various systems and configurations, and other features, functions, and/or properties disclosed herein.

As used herein, the term "approximately" is construed to mean plus or minus five percent of the range unless otherwise specified.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A cooler assembly, comprising:
   a heat exchanger with a heat exchanger surface having a dielectric layer of dielectric material physically coupled thereto,
   wherein a single or plurality of layers of another material are coupled to an exposed surface of the dielectric layer and the single or plurality of layers of the another material includes a printed thick film layer; and
   at least one component coupled to the heat exchanger such that the at least one component is electrically isolated from the heat exchanger surface by the dielectric material, wherein the heat exchanger surface is electrically isolated with respect to the at least one component.

2. The cooler assembly of claim 1, wherein the heat exchanger comprises a top plate and a core plate, wherein the top plate and core plate are brazed at a plurality of interfaces comprising surfaces of outer walls of the core plate.

3. The cooler assembly of claim 2, wherein the heat exchanger surface is a portion of the top plate of the heat exchanger.

4. The cooler assembly of claim 1, wherein the dielectric layer is a printed thick film layer.

5. The cooler assembly of claim 1, wherein a conductor layer comprising thermally and electrically conductive material compatible with metallurgic bonding is physically coupled to the exposed surface of the dielectric layer, such that the dielectric layer is sandwiched between the conductor layer and the heat exchanger surface.

6. The cooler assembly of claim 5, wherein the conductor layer is a printed thick film layer that is printed and fired on the exposed surface of the dielectric layer.

7. The cooler assembly of claim 5, wherein a bulk metal layer is physically and electrically coupled to the conductor layer via metallurgic bonding, such that the conductor layer is sandwiched between the bulk metal layer and the dielectric layer.

8. The cooler assembly of claim 7, wherein an electrical component or a plurality of electrical components are physically and electrically coupled to the bulk metal layer via metallurgic bonding, such that the bulk metal layer is sandwiched between the electrical component or electrical components and the conductor layer.

9. The cooler assembly of claim 8, wherein the heat exchanger surface has a plurality of dielectric layers comprising the dielectric layer, wherein the dielectric layers are patterned into a series of pads that are electrically isolated from one another.

10. The cooler assembly of claim 8, wherein the dielectric layer, the conductor layer, the bulk metal layer, and the electrical component or the electrical components are not physically coupled to a component comprised of metallized ceramic.

11. The cooler assembly of claim 8, wherein there are a plurality of conductor layers physically coupled to the dielectric layer.

12. The cooler assembly of claim 8, wherein the heat exchanger surface does not comprise a metallized ceramic and is not coupled to a component or feature comprising a metallized ceramic.

13. A cooler assembly, comprising;
   a heat exchanger having a heat exchanger surface that physically couples at least an electrical section comprised of:
   a dielectric layer of dielectric material;
   a conductor layer of thermally and electrically conducting material that is compatible with metallurgic bonding;
   a bulk metal layer that is compatible with metallurgic bonding; and
   an electrical component;
   wherein, the dielectric layer is physically coupled to the heat exchanger surface, and wherein the conductor layer, the bulk metal layer, and the electrical component are coupled to an exposed surface of the dielectric layer such that the conductor layer is sandwiched between the bulk metal layer and the dielectric layer.

14. The cooler assembly of claim 13, wherein the dielectric layer is a printed thick film layer and the conductor layer is a printed thick film layer.

15. The cooler assembly of claim 13, wherein the heat exchanger does not include a thermal interface material and a metallized ceramic sandwiched between the dielectric layer and the heat exchanger surface, coupled to the exposed surface of dielectric layer, or coupled to a component or feature coupled to the exposed surface of the dielectric layer.

16. The cooler assembly of claim 13, with a plurality of electrical sections, wherein each electrical section is formed into a plurality of first pads comprising the dielectric layer and at least a second pad, wherein the second pad comprises a conductor layer physically coupled to an exposed surface of one of the first pads, a bulk metal layer physically and electrically coupled to the conductor layer, and an electrical component physically and electrically coupled to the bulk metal layer.

17. The cooler assembly of claim 16, wherein there are a plurality of second pads directly coupled to at least one of the first pads, wherein the second pads are comprised of materials of the second pad.

18. The cooler assembly of claim 13, where the bulk metal layer or a plurality of bulk metal layers are physically and electrically coupled to the conductor layer via a metallurgic bond, and the electrical component is physically and electrically coupled to each bulk metal layer via a metallurgic bond.

19. A method of assembling an electrical section to a cooler assembly, comprising:
   applying a dielectric layer via paste printing to a heat exchanger surface;
   firing and/or curing the dielectric layer;
   applying a conductor layer via paste printing on an exposed surface of the dielectric layer;
   firing and/or curing the conductor layer;
   physically and electrically coupling a bulk metal layer to the conductor layer via metallurgic bonding; and
   physically and electrically coupling an electronic component to the bulk metal layer via metallurgic bonding.

20. A cooler assembly, comprising:
   a heat exchanger with a heat exchanger surface having a dielectric layer of dielectric material physically coupled thereto,
   wherein a single or plurality of layers of another material are coupled to an exposed surface of the dielectric layer; and
   at least one component coupled to the heat exchanger such that the at least one component is electrically isolated from the heat exchanger surface by the dielectric material, wherein the heat exchanger surface is electrically isolated with respect to the at least one component, wherein a conductor layer comprising thermally and electrically conductive material compatible with metallurgic bonding is physically coupled to the exposed surface of the dielectric layer, such that the dielectric layer is sandwiched between the conductor layer and the heat exchanger surface, wherein a bulk metal layer is physically and electrically coupled to the conductor layer via metallurgic bonding, such that the conductor layer is sandwiched between the bulk metal layer and the dielectric layer, wherein an electrical component or a plurality of electrical components are physically and electrically coupled to the bulk metal layer via metallurgic bonding, such that the bulk metal layer is sandwiched between the electrical component or electrical components and the conductor layer, and wherein the heat exchanger surface has a plurality of dielectric layers comprising the dielectric layer, wherein the dielectric layers are patterned into a series of pads that are electrically isolated from one another.

* * * * *